United States Patent
Huang

(10) Patent No.: US 6,924,705 B2
(45) Date of Patent: Aug. 2, 2005

(54) INJECT SYNCHRONOUS NARROWBAND REPRODUCIBLE PHASE LOCKED LOOPED

(75) Inventor: Lizhong Huang, Guangdong (CN)

(73) Assignee: Huawei Technologies Co., Ltd., Shenzen (CN)

(*) Notice: Subject to any disclaimer, the term of this patent is extended or adjusted under 35 U.S.C. 154(b) by 32 days.

(21) Appl. No.: 10/297,503
(22) PCT Filed: May 30, 2001
(86) PCT No.: PCT/CN01/00879
§ 371 (c)(1),
(2), (4) Date: May 22, 2003
(87) PCT Pub. No.: WO01/95491
PCT Pub. Date: Dec. 13, 2001

(65) Prior Publication Data
US 2003/0184389 A1 Oct. 2, 2003

(51) Int. Cl.[7] .................................................. H03L 7/00
(52) U.S. Cl. .............................. 331/10; 331/16; 331/34; 331/1 A; 327/156; 327/157; 327/159; 375/376; 369/47.28; 369/124.14
(58) Field of Search ............................ 331/10, 16, 1 A, 331/25, 34; 455/260; 327/156, 157, 159; 375/376; 369/47.28, 124.14

(56) References Cited

U.S. PATENT DOCUMENTS

| 4,347,484 A | * | 8/1982 | Vandegraaf | 331/25 |
| 5,172,357 A | * | 12/1992 | Taguchi | 369/47.28 |
| 6,054,903 A | * | 4/2000 | Fiedler | 331/17 |

* cited by examiner

Primary Examiner—Arnold Kinkead
(74) Attorney, Agent, or Firm—Trop, Pruner & Hu, P.C.

(57) ABSTRACT

The invention discloses an injection synchronization narrowband regenerative phase-locked loop (ISNRPLL) circuit. The circuit includes a synchronous oscillation loop composed by the connecting of an injection synchronization narrowband regenerative voltage-controlled oscillator (ISNRVCO) and an exclusive-OR double frequency circuit; a phase-locked loop composed by the connecting of a digital phase detector, a charge pump and a loop filter, and a D type flip-flop for outputting data. The ISNRVCO does not ask much of the syntonic loop, and can be implemented by integrating inductance on a chip. Preferably, it can be integrated completely by using the deep submicron digital CMOS technology, so there are only a few external elements. Simulation shows that the capture range, capture time and phase noise etc. of the INSRPLL are all better than the conventional phase-locked loop circuit and can be used in GHz level high-speed clock recovery integrated circuit.

11 Claims, 3 Drawing Sheets

INJECT SYNCHRONOUS NARROWBAND REPRODUCIBLE PHASE LOCKED LOOPED

FIELD OF THE TECHNOLOGY

The present invention relates generally to a high-speed clock recovery circuit, and more particularly to a circuit design of injection synchronization narrow-band regenerative phase-locked loop (ISNRPLL).

BACKGROUND OF THE INVENTION

In high-speed clock recovery integrated circuit design, it is generally applied that passive filter circuit, phase-locked loop (PLL) circuit and synchronous oscillator (SO) circuit. Then, according to the applied different technology and circuit working condition, an appropriate adjustment is taken again.

The advantages of passive filter circuit are simple structure, good frequency phase stability. The disadvantages of passive filter circuit are as follow: it cannot be integrated, working frequency region is narrow, and it cannot be adjusted within a chip.

The advantages of synchronous oscillator circuit are as follow: noise bandwidth without relation with capture range, higher input sensitivity, faster capture speed than second-order PLL and better suppression ability for noise of carrier frequency remote end. The disadvantages of synchronous oscillator circuit are as follow: phase difference cannot be cancelled, phase difference is related with frequency deviation, and noise performance of carrier frequency near end is worse.

The advantages of PLL circuit are as follow: it can be fully integrated in a semiconductor chip, it can trace the change of input data baud-rate, and in a certain condition, the phase-difference can be cancelled. The disadvantages of PLL circuit are as follow: the circuit is rather complex, capture range of itself is rather small, it is difficult to solve conflict of the noise bandwidth and the capture range, and the capture speed is rather slow. Nevertheless, when combing the PLL circuit with other circuits, performance can be improved greatly; therefore, it is one of the main directions of high-speed clock-recovery circuit design.

The injection-locked PLL (ILPLL) circuit, which is an improvement of PLL circuit and SO circuit, includes IL circuit and PLL circuit. FIG. 1 shows a conventional ILPLL circuit block diagram that is consisted of two parts of circuit: IL and PLL. In FIG. 1, inside the dot-line block is the PLL path (path means an uncompleted PLL circuit), and outside the dot-line block is the IL path (path means an uncompleted IL circuit). The PLL path includes a Phase Shifter 11, a Loop Filter 12 and a phase detector 14. The IL path mainly includes a Voltage Control Oscillator (VCO) 13. The input data Vi with phase $\theta_i$ is sent to the input ports of the phase shifter 11 and the VCO 13 simultaneously. The output data of the phase shifter 11 with phase $\theta_i+\alpha$ is sent to the phase detector 14. After processed by the loop filter 12, the output data of the phase detector 14 with phase $\theta_e$ is used as the control signal of the VCO 13. The VCO 13 outputs a clock signal with phase $\theta_o$, which is also returned to phase detector 14.

The combined circuit of an IL and a PLL, mentioned above, in certain degree, combines the advantages of two circuits and compensates their individual disadvantages. Nevertheless, there are two disadvantages, which affect the implementation in a semiconductor chip. The two disadvantages are:

(1) when a clock frequency is an ultrahigh frequency, there are some difficulties to implement on a chip;

(2) the present circuit cannot better adjust the phase difference between the input data Vi and the output clock.

In addition, usually the circuit needs to add a double frequency circuit 15 (X2) in front of the output in order to produce a needed clock (Vo). The double frequency circuit brings another phase deviation, which is difficult to control.

SUMMARY OF THE INVENTION

In order to overcome the disadvantages of present ILPLL circuit, the invention provides an Injection Synchronization Narrowband Regenerative PLL (ISNRPLL) circuit, which is based on Injection Synchronization Narrowband Regenerative VCO (ISNRVCO). The ISNRPLL has all advantages of conventional ILPLL circuit, and is suitable to be integrated with depth-submicron digital CMOS technology. Moreover, the ISNRPLL can rapidly adjust phase relation between the input data and the output clock to implement a clock regeneration and auto-calibration with the input data.

The technical scheme to implement the invention is that an INSNRPLL circuit includes a synchronous oscillation loop and a phase-locked loop, it is characterized that:

Said synchronous oscillation loop is an injection-locked loop, which includes an ISNRVCO. The input terminal of the ISNRVCO is inputted by a clock frequency component generated by the input data. The output terminal of the ISNRVCO outputs a regenerated clock signal;

Said phase-locked loop includes a digital phase detector with bang-bang working mode, a charge pump and a loop filter. The digital phase detector detects a phase difference signal between the input data and output regenerated clock signal of ISNRVCO; The charge pump receives phase difference signal outputted from the digital phase detector; The input terminal and the output terminal of the loop filter are connected to output terminal of said charge pump and voltage control terminal of said ISNRVCO, respectively.

In said synchronous oscillation loop also includes an exclusive double-frequency circuit, used to generate a clock frequency component from said input data.

In addition, a trigger circuit is included, the trigger circuit converts the input data to an output data under the control of the regenerated clock signal outputted from said ISNRVCO.

Said trigger circuit is a D-type flip-flop. The input terminal of the D-type flip-flop is connected with said input data signal. The clock input terminal of the D-type flip-flop is connected with said regenerated clock signal. The D-type flip-flop outputs said output data.

Said ISNRVCO is consisted of one stage added amplifier and odd number stages tuned amplifier, which are sequentially connected. The data output terminal of each pre-stage amplifier is connected to the data input terminal of the successive post-stage amplifier. The data output terminal of the last stage tuned amplifier is connected to the data input terminal of said added amplifier and forms a positive feedback loop. The control terminal of each amplifier stage is inputted a tuning control signal.

Said odd number stages of tuned amplifiers are three stages. The added amplifier and each stage of a tuned amplifier have two data input terminals, two data output terminals and two control terminals. Two data output terminals of each pre-stage amplifier are connected to two data input terminals of the successive post-stage amplifier. Two data output terminals of the last tuned amplifier are connected to two data input terminals of said added amplifier according to the positive feedback loop connection. Two control terminals of each stage amplifier are inputted tuning control signals through two control ports.

Said added amplifier is composed of the followings. An injection signal differential-pair is consisted of first and second MOS transistors. A feedback signal differential-pair is consisted of third and fourth MOS transistors. First and second current source MOS transistors provide current source to said injection signal differential-pair and said feedback signal differential-pair, respectively. First and second current source MOS transistors are connected to a low level power supply Vss through third current source MOS transistor. A differential source follower of output signal of added amplifier is consisted of fifth, sixth, seventh and eighth MOS transistors. First and second inductors are respectively connected to two output terminals (S1 and S2) of said injection signal differential-pair and said feedback signal differential-pair, and also are connected to high level power supply Vdd. There are four equivalent variable-capacitance diodes: first, second, third and fourth. One end of first and second equivalent variable-capacitance diodes is connected to first control terminal, and another end is respectively connected to two output terminals (S1 and S2) of said injection signal differential-pair and said feedback signal differential-pair. The two output terminals S1 and S2 are also two inputs of said differential source follower. One end of third and fourth equivalent variable-capacitance diodes is connected to second control port; and another end is respectively connected to two output terminals (S1 and S2) of said injection signal differential-pair and said feedback signal differential-pair.

There is a ninth MOS transistor in said added amplifier. The ninth MOS transistor is serially connected between high level power supply Vdd and said first and second inductors, and is used to adjust the static working point of said injection signal differential-pair.

Said tuned amplifier is composed of the followings. An input signal differential-pair is consisted of tenth and eleventh MOS transistors, third and fourth inductors are serially connected to two outputs of the differential-pair, and fourth current source MOS transistor provide current source to the differential-pair. Fourth current source MOS transistor is connected to low level power supply Vss. Fifth, sixth, seventh and eighth equivalent variable-capacitance diodes and twelfth, thirteenth, fourteenth and fifteenth MOS transistors constitute a differential source follower for signal output of a tuned amplifier. One end of fifth and sixth equivalent variable-capacitance diodes is connected to first control port, another end is connected to two output terminals of said differential pair and two input terminals of said differential source follower, respectively. One end of seventh and eighth equivalent variable-capacitance diodes is connected to second control port, another end is respectively connected to two output terminals of said differential pair and two input terminals of said differential source follower.

There is a sixteenth MOS transistor in said tuned amplifier, which is serially connected between said high-level power supply Vdd and said third and fourth inductors to adjust the static working point of said input signal differential pair.

The ISNRVCO is the kernel part of the ISNRPLL of the invention. Phase difference and frequency difference information, which is produced by a digital phase-detector with bang-bang working mode, controls ISNRVCO through a low-pass section consisted of a charge pump and a loop filter. Requirement of the resonance circuit in an ISNRVCO is not high. The resonance circuit can be implemented by integrated inductance on a chip. Therefore, it is suitable for a variety of technologies, it needs only a few external components and it is not need external reference clock. Two parts: synchronous oscillator and phase-locked loop are interacted with each other. Therefore, performance of the circuit is raised greatly; such as capture range, capture time and phase noise etc. are all better than the conventional phase-locked loop circuit and can be used in GHz level high-speed clock recovery integrated circuit.

According to results of simulation, frequency capture range of an ISNRPLL circuit is greater than conventional two orders phase-locked loop in several ten times. Therefore, in some application, there is no need to set special frequency capture circuit. Simulation also shows that frequency capture time of an ISNRPLL circuit is improved in a greater degree. Noise analysis shows that at carrier frequency remote end and near end, noise performance is better.

EMBODIMENTS OF THE INVENTION

Figure 1:
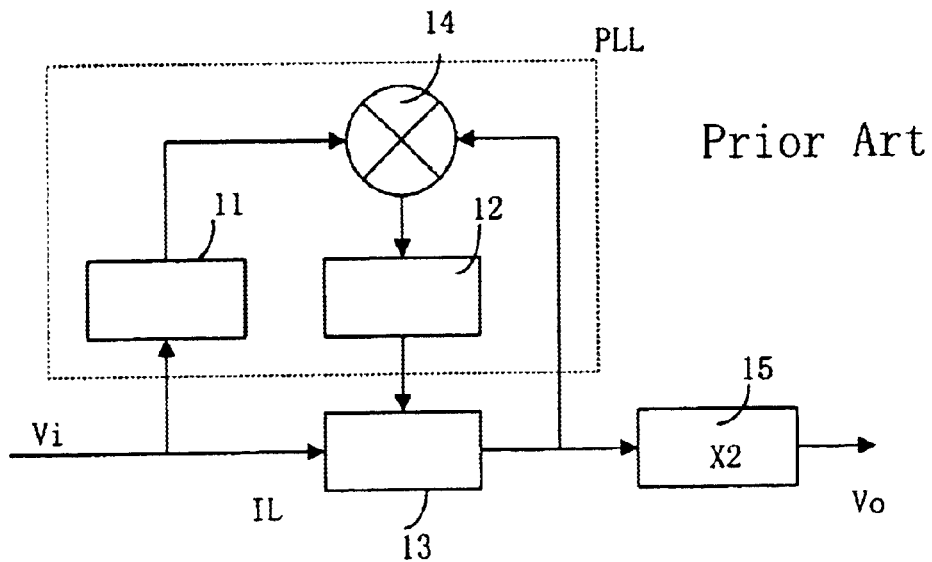
FIG. 1 is a conventional ILPLL block diagram.
Figure 2:
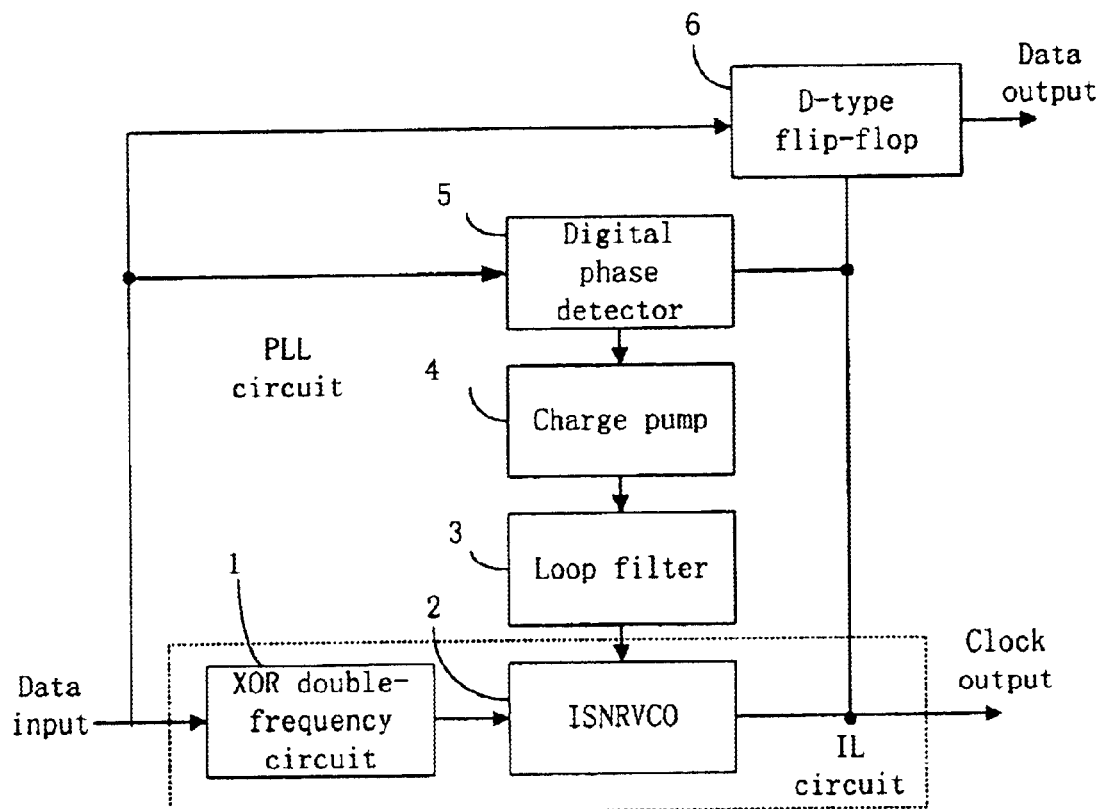
FIG. 2 is an ISNRPLL block diagram of the invention.

FIG. 2 shows an ISNRPLL circuit principle block diagram. The ISNRPLL circuit includes an exclusive-OR double-frequency circuit 1, an ISNRVCO 2, a digital phase detector 5 working with bang-bang mode, a charge pump 4, a loop filter 3 and a D-type flip-flop 6. The exclusive-OR double-frequency circuit 1 and the ISNRVCO 2 constitute the injection locked loop (IL circuit). The bang-bang digital phase detector 5, the charge pump 4 and loop filter 3 constitute the PLL (PLL circuit). The D-type flip-flop 6 is used for data decision output. A phase difference and frequency difference information, produced by the digital phase detector 5, controls the ISNRVCO 2 through a low-pass sector consisted of charge pump 4 and loop filter 3.

Figure 3:
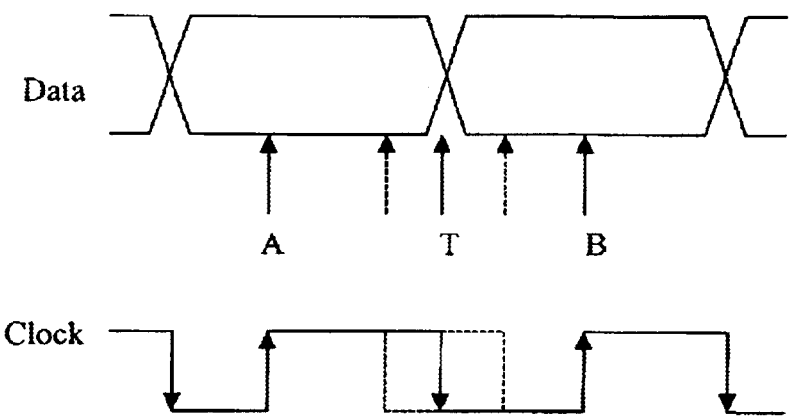
FIG. 3 is the working principle of a phase detector with bang-bang mode.

FIG. 3 shows principle of the digital phase-detector 5 with bang-bang working mode. Data are sampled at the clock rising edge and falling edge. A phase relation of data and clock is decided according to a judgement of the sampled data. Suppose it is defined that sampled data at moments A, T and B are DA, DT and DB, respectively; then there is decision logic as follow:

(1) when DA=DT, the phase of the clock is lead;

(1) when DT=DB, the phase of the clock is delay;

(1) when DA=DB, data are unchanged and phase decision is ineffective.

When the clock phase is a leading one, the digital phase detector 5 outputs one clock-period negative pulse. When the clock phase is a delay one, the digital phase detector 5 outputs one clock-period positive pulse. When the decision is ineffective, the digital phase detector 5 outputs a zero. The charge pump 4 is charged and discharged by the positive pulse and negative pulse, respectively; and this is a bang-bang working mode.

Figure 4:
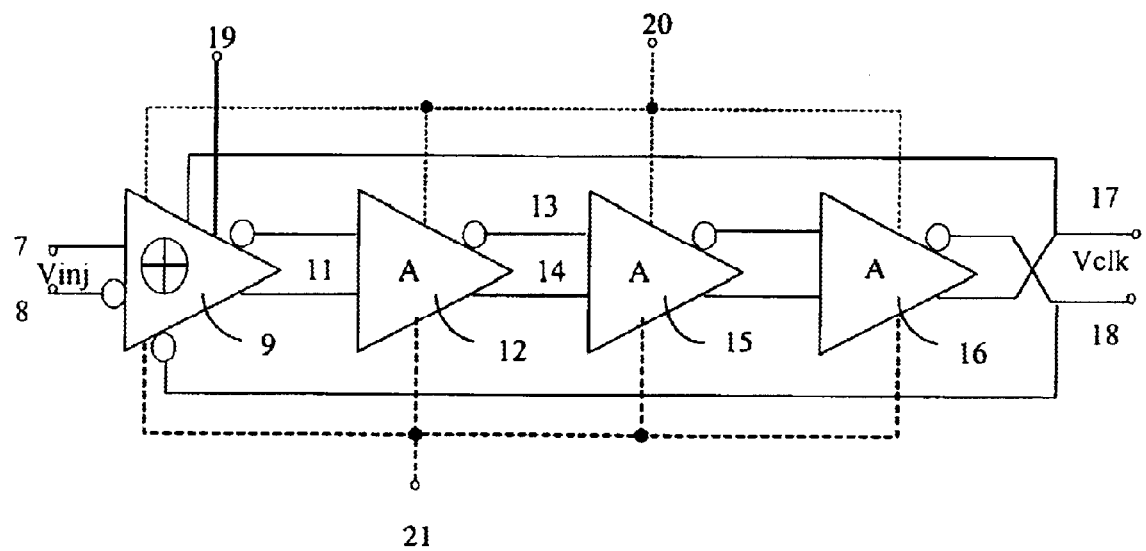
FIG. 4 is an ISNRVCO circuit diagram in the ISNRPLL circuit.

FIG. 4 shows an ISNRVCO 2 circuit diagram. The ISNRVCO 2 includes one stage added amplifier 9 and three stages tuned amplifiers 12, 15 and 16, which constitute a positive feedback loop. In this loop, for two consecutive amplifiers, two data output terminals of the pre-stage amplifier are connected to two data input terminals of the post-stage amplifier. Two data output terminals 17 and 18 of the tuned amplifier 16 are connected to two feedback terminals of the added amplifier 9 to form a positive feedback. Two control terminals of every stage amplifier are connected to the control ports 20 and 21, respectively. Two tuning control signals are connected to the control ports 20 and 21; wherein port 20 is connected to output of the loop filter 3, and port 21 is an external control port.

Figure 5:
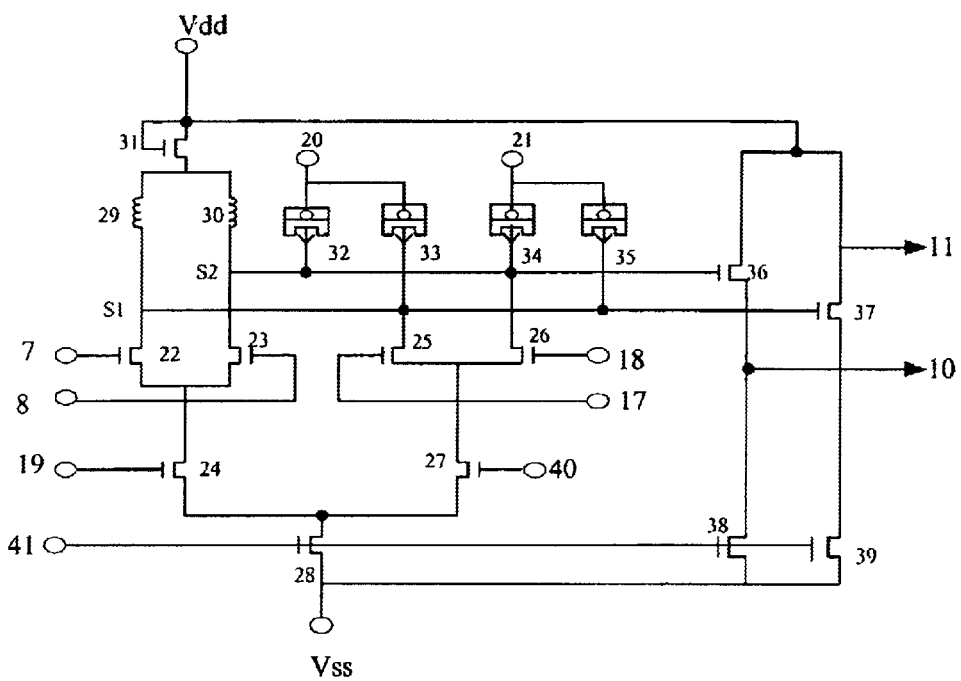
FIG. 5 is a typical circuit diagram of an added amplifier in the ISNRVCO.

FIG. 5 shows a typical circuit of added amplifier 9. An injection signal differential-pair is consisted by MOS transistor 22 and 23. A feedback signal differential-pair is consisted by MOS transistor 25 and 26. Two current source transistors 24 and 27, which are connected to the low level power supply Vss through the current transistor 28, provide current to the two differential pairs, mentioned above, respectively. The MOS transistors 36, 37, 38 and 39 compose a differential source follower for signal output. Two output terminals S1 and S2 of the two differential pairs are serially connected with two integrated inductors 29 and 30, respectively. One end of two equivalent variable-capacitance diodes 32 and 33 is connected to the control port 20, another end of the two equivalent variable-capacitance diodes 32 and 33 is connected to output terminals S1 and S2, respectively. The grid terminal 19 of the MOS transistor 24 and the grid terminal 40 of the MOS transistor 27 control working current of the two differential pairs, respectively, and decide the injection signal strength. The MOS transistor 31, connected serially in the output loop of the differential pair, is used to adjust the static working point.

Figure 6:
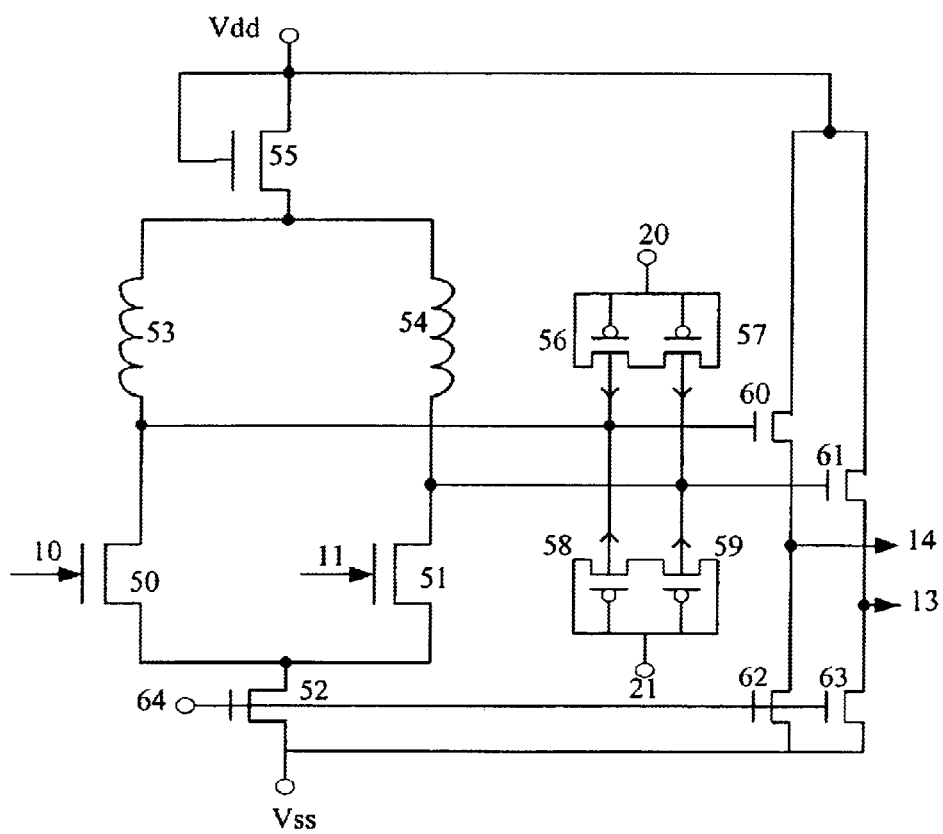
FIG. 6 is a typical circuit diagram of a tuned amplifier in the ISNRVCO.

FIG. 6 shows a typical circuit of tuned amplifiers 12, 15 and 16. An input signal differential pair is consisted of MOS transistors 50 and 51, and two integrated inductance 53 and 54 are serially connected to two outputs of the differential pair, respectively. The current source transistor 52 provides current source to the differential pair. Four equivalent variable-capacitance diodes 56, 57, 58 and 59, and four MOS transistors 60, 61, 62 and 63 compose a differential source follower for signal output. One end of the equivalent variable-capacitance diodes 56 and 57 is connected to the control port 20, another end is connected to two outputs of the differential pair. One end of the equivalent variable-capacitance diodes 58 and 59 is connected to the control port 21, another end is connected to two outputs of the differential pair. The differential pair 50 and 51, the two integrated inductance 53 and 54, the four equivalent variable-capacitance diodes 56, 57, 58 and 59 and related parasitic capacitance composes a tuned circuit. The MOS transistor 55, connected serially to output circuit of the differential pair, is used to adjust static working point of the differential pair.

In an ISNRVCO, three tuned amplifiers 12, 15 and 16 are the same circuit.

The resonance circuit in an ISNRVCO, used in an ISNRPLL of the invention, can be implemented by integrated inductance, which is suitable for depth submicron technology, in a semiconductor chip and a few connected external elements. Design of the circuit can be used in a GHz level high-speed clock recovery integrated circuit.

What is claimed is:

1. An injection synchronization narrowband regenerative phase-locked loop (INSNRPLL) comprises a synchronous oscillation loop and a phase-locked loop, it is characterized that:

the synchronous oscillation loop is an injection-locked loop, and comprises an injection synchronization narrowband regenerative voltage-controlled oscillator (ISNRVCO) with an input terminal inputted by a clock frequency component generated by the input data and an output terminal outputting a regenerated clock signal;

the phase-locked loop comprises:

a digital phase detector with bang-bang working mode, detecting a phase difference signal between the input data and output regenerated clock signal of the ISNRVCO;

a charge pump, receiving phase difference signal outputted from the digital phase detector;

a loop filter with an input terminal and an output terminal connected to output terminal of the charge pump and voltage control terminal of the ISNRVCO, respectively.

2. The ISNRPLL according to claim 1, wherein the synchronous oscillation loop further comprises an exclusive-OR double-frequency circuit, used to generate a clock frequency component from the input data.

3. The ISNRPLL according to claim 1, further comprises a trigger circuit which converts the input data to an output data under the control of the regenerated clock signal outputted from the ISNRVCO.

4. The ISNRPLL according to claim 1, wherein the synchronous oscillation loop further comprises an exclusive double-frequency circuit, used to generate a clock frequency component from the input data, and also comprises a trigger circuit which converts the input data to an output data under the control of the generated clock signal outputted from the ISNRVCO.

5. The ISNRPLL according to claims 4, wherein the trigger circuit is a D-type flip-flop, whose input terminal is connected with the input data signal, whose clock input terminal is connected with the regenerated clock signal, and whose output terminal outputs the output data.

6. The ISNRPLL according to claim 1, wherein the ISNRVCO comprises one stage added amplifier and odd number stages tuned amplifier connected sequentially, data output terminal of each amplifier is connected to the data input terminal of a successive amplifier, data output terminal of the last tuned amplifier is connected to the data input terminal of the added amplifier and forms a positive feedback loop, and control terminal of each stage amplifier is inputted a tuning control signal.

7. The ISNRPLL according to claim 6, wherein the odd number stages of tuned amplifiers are three stages, the added amplifier and each stage tuned amplifier have two data input terminals, two data output terminals and two control terminals; two data output terminals of each amplifier are connected to two data input terminals of a successive amplifier, two data output terminals of the last tuned amplifier are connected to two data input terminals of the added amplifier according to the positive feedback loop connection, and two control terminals of each stage amplifier are inputted tuning control signals, respectively.

8. The ISNRPLL according to claim 7, wherein the added amplifier comprises:

an injection signal differential-pair consisted of first and second MOS transistors;

a feedback signal differential-pair consisted of third and fourth MOS transistors;

a first and a second current source MOS transistors providing current source to the injection signal differential-pair and the feedback signal differential-pair, respectively, and a third current source MOS transistor, wherein the first and the second current source MOS transistors is connected to a low level power supply Vss through the third current source MOS transistor;

a differential source follower for signal output of the added amplifier, consisted of a fifth, a sixth, a seventh and a eighth MOS transistors;

a first and a second inductors, respectively connected to two output terminals (S1 and S2) of the injection signal differential-pair and the feedback signal differential-pair in series, and also connected to a high level power supply Vdd;

a first, a second, a third and a fourth equivalent variable-capacitance diodes, wherein one end of the first and the second equivalent variable-capacitance diodes is connected to a first control port, and another end is respectively connected to two output terminals (S1 and S2) of the injection signal differential-pair and the feedback signal differential-pair, the two output terminals (S1 and S2) also are two inputs of the differential source follower; one end of the third and the fourth equivalent variable-capacitance diodes is connected to a second control port, and another end is respectively connected to two output terminals (S1 and S2) of the injection signal differential-pair and the feedback signal differential-pair, the two output terminals (S1 and S2) also are two inputs of the differential source follower.

9. The ISNRPLL according to claim 8, wherein the added amplifier further comprises a ninth MOS transistor which is serially connected between the high level power supply Vdd and the first and the second inductors, and is used to adjust a static working point of the injection signal differential-pair.

10. The ISNRPLL according to claim 9, wherein the tuned amplifier comprises:

an input signal differential-pair consisted of a tenth and a eleventh MOS transistors;

a third and a fourth inductors serially connected to two outputs of the input signal differential-pair, respectively;

a fourth current source MOS transistor providing current source to the input signal differential-pair, and the fourth current source MOS transistor is connected to a low level power supply Vss;

a fifth, a sixth, a seventh and a eighth equivalent variable-capacitance diodes;

a differential source follower for signal output of a tuned amplifier, which is consisted of a twelfth, a thirteenth, a fourteenth and a fifteenth MOS transistors;

wherein one end of the fifth and the sixth equivalent variable-capacitance diodes is connected to a first control port, another end is connected to two output terminals of the input signal differential pair and two input terminals of the differential source follower, respectively; one end of the seventh and the eighth equivalent variable-capacitance diodes is connected to a second control port, another end is respectively connected to two output terminals of the input signal differential pair and two input terminals of the differential source follower.

11. The ISNRPLL according to claim 10, wherein the tuned amplifier further comprises a sixteenth MOS transistor, which is serially connected between the high-level power supply Vdd and the third and the fourth inductors to adjust the static working point of the input signal differential pair.

* * * * *

UNITED STATES PATENT AND TRADEMARK OFFICE
CERTIFICATE OF CORRECTION

PATENT NO. : 6,924,705 B2
APPLICATION NO. : 10/297503
DATED : August 2, 2005
INVENTOR(S) : Lizhong Huang It is certified that error appears in the above-identified patent and that said Letters Patent is hereby corrected as shown below:

On the Title Page:

At Item (73), "Shenzen" should be -- Shenzhen --.

Signed and Sealed this

Tenth Day of April, 2007

JON W. DUDAS
*Director of the United States Patent and Trademark Office*